US010750595B1

(12) United States Patent
Ozalevli et al.

(10) Patent No.: US 10,750,595 B1
(45) Date of Patent: Aug. 18, 2020

(54) FREQUENCY-TO-CURRENT/VOLTAGE CONVERTER BASED MIXED-MODE LED DRIVERS

(71) Applicant: Apple Inc., Cupertino, CA (US)

(72) Inventors: Erhan Ozalevli, Santa Clara, CA (US); Evaldo M. Miranda, Jr., Saratoga, CA (US); Mohammad J. Navabi-Shirazi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/427,865

(22) Filed: May 31, 2019

(51) Int. Cl.
*H05B 45/37* (2020.01)
*H02M 1/08* (2006.01)
*H03L 7/183* (2006.01)
*H05B 45/00* (2020.01)
*H05B 45/44* (2020.01)

(52) U.S. Cl.
CPC .............. *H05B 45/37* (2020.01); *H02M 1/08* (2013.01); *H03L 7/183* (2013.01); *H05B 45/00* (2020.01); *H05B 45/44* (2020.01)

(58) Field of Classification Search
CPC ............ H05B 33/0815; H05B 33/0824; H05B 33/0842; H02M 1/08; H03L 7/183
USPC ........................................................ 315/193
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,184,064 B2 | 2/2007 | Zimmerman et al. | |
| 7,279,857 B2 | 10/2007 | Babb | |
| 7,365,661 B2 | 4/2008 | Thomas | |
| 7,663,607 B2 | 2/2010 | Hotelling et al. | |
| 7,745,970 B2 | 6/2010 | Radecker | |

(Continued)

FOREIGN PATENT DOCUMENTS

| | | |
|---|---|---|
| JP | 2000163031 | 6/2000 |
| JP | 2002342033 | 11/2002 |
| WO | WO2009094761 A1 | 8/2009 |

OTHER PUBLICATIONS

Lee, S.K. et al. (Apr. 1985). "A Multi-Touch Three Dimensional Touch-Sensitive Tablet," Proceedings of CHI: ACM Conference on Human Factors in Computing Systems, pp. 21-25.

(Continued)

*Primary Examiner* — Don P Le

(57) ABSTRACT

LED backlight circuits for a display and methods for operating the circuits are disclosed. The LED backlight circuit includes a set of drivers and a set of LED strings. A driver can control a light output level of the LED strings. The LED strings can be controlled by a mixed-mode LED driver that utilizes a PWM control signal over a first range of light output levels and an analog control signal over a second range of light output levels. Clock signals used for PWM control and for frequency-to-current or frequency-to-voltage conversion for analog control can both be generated from a phase locked loop (PLL).

20 Claims, 11 Drawing Sheets

(56) References Cited

U.S. PATENT DOCUMENTS

| | | |
|---|---|---|
| 8,373,643 B2 | 2/2013 | Zhao |
| 8,479,122 B2 | 7/2013 | Hotelling et al. |
| 8,558,497 B2 | 10/2013 | Wright |
| 9,876,454 B2 | 1/2018 | Rodriguez |
| 2006/0197753 A1 | 9/2006 | Hotelling |
| 2015/0200599 A1* | 7/2015 | Mao .................. H02M 3/33507 |
| | | 363/21.17 |
| 2018/0120877 A1 | 5/2018 | Zhao |
| 2018/0351455 A1 | 12/2018 | Fan |
| 2019/0013733 A1 | 1/2019 | Trichy |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

FREQUENCY-TO-CURRENT/VOLTAGE CONVERTER BASED MIXED-MODE LED DRIVERS

FIELD

This disclosure relates generally to systems, methods, and apparatuses for improving display devices using a backlight controller. More specifically, this disclosure relates to multi-string light emitting diode (LED) drivers and associated current switching techniques.

BACKGROUND

Display screens of various types of technologies, such as liquid crystal displays (LCDs), organic light emitting diode (OLED) displays, etc., can be used as screens or displays for a wide variety of electronic devices, including consumer electronics such as televisions, computers, and handheld devices (e.g., mobile telephones, tablet computers, audio and video players, gaming systems, etc.). LCD devices, for example, can provide a flat display in a relatively thin package that can be suitable for use in a variety of electronic goods. In addition, LED devices may use less power than comparable display technologies, making them suitable for use in battery-powered devices, or in other contexts where it is desirable to minimize power usage.

LCDs generally include a backlight that provides visible light to a liquid crystal layer. The liquid crystal layer can take the light from the backlight and can control the brightness and color at each individual pixel in the display in order to render a desired image. One metric that can be used to judge the performance of a display is the uniformity of color generated by the display over varying levels of brightness. In some displays, the brightness can be adjusted by increasing or decreasing the drive current using a LED driver, which can be referred to as analog dimming. For example, 50% brightness can be achieved by applying a drive current equal to 50% of the maximum current. In some instances, a change in drive current can result in a shift in the wavelength (i.e., color) of the light produced by the display. Additionally, analog dimming may require an analog control signal, which may not be readily available or may require complex circuitry.

Additionally or alternatively, the brightness may be adjusted by using pulse width modulation (PWM) dimming, where the duty cycle of the drive current can be increased or decreased. In some instances, the drive current applied may be equal to 100% of the maximum current. For example, 50% brightness can be achieved by applying a drive current equal to 100% of the maximum current at a 50% duty cycle. The duty cycle in PWM techniques can result in the drive current being applied during an on pulse, and not being applied during an off pulse. The PWM signal can include on pulses that alternate with off pulses. In some instances, the frequency of the PWM signal may need to above a certain threshold frequency (e.g., 100 Hz) to avoid the pulsing of the PWM signal being visible to the human eye. A backlight circuit that includes LED driver(s) that can perform at PWM frequencies much higher (e.g., 50 kHz) than this threshold frequency may be desired.

Additionally, certain devices, such as laptops and monitors, may have high-resolution displays, where global dimming (e.g., uniform dimming across all or the majority of the display) may be desired. Also, the quality of the display may benefit from precise matching of the drive current between LED strings and high linearity when the backlight circuit is operated at high PWM frequencies.

SUMMARY

Disclosed herein is a LED backlight circuit for a display. The LED backlight circuit includes a set of drivers and a set of LED strings. A driver can control a light output level of the LED strings. The LED strings can be controlled by a mixed-mode LED driver that utilizes a PWM control signal over a first range of light output levels and an analog control signal over a second range of light output levels. Clock signals used for PWM control and for frequency-to-current or frequency-to-voltage conversion for analog control can both be generated from a phase locked loop (PLL).

DETAILED DESCRIPTION

In the following description of examples, reference is made to the accompanying drawings in which it is shown by way of illustration specific examples that can be practiced. It is to be understood that other examples can be used and structural changes can be made without departing from the scope of the various examples.

Disclosed herein is a LED backlight circuit for a display. The LED backlight circuit includes a set of drivers and a set of LED strings. A driver can control a light output level of the LED strings. The LED strings can be controlled by a mixed-mode LED driver that utilizes a PWM control signal over a first range of light output levels and an analog control signal over a second range of light output levels. Clock signals used for PWM control and for frequency-to-current or frequency-to-voltage conversion for analog control can both be generated from a phase locked loop (PLL).

The various examples are described in the context of LEDs, LED displays, and associated backlight circuitry. It should be appreciated that these examples are merely illustrative and the disclosed backlight circuit and methods described herein may be implemented in other contexts in which the benefits of the disclosure are desired (e.g., for illumination of keyboards, flash components, etc.). These benefits may include, but are not limited to, increased linearity, increased monotonicity, increased accuracy, reduced area, and reduced complexity, as discussed in detail below.

As used throughout this specification, a reference number without an alpha character following the reference number can refer to one or more of the corresponding reference, the group of all references, or some of the references. For example, "220" can refer to any one of the strings 220 (e.g., string 220A, string 220B, etc.), can refer to all of the strings 220, or can refer to some of the strings (e.g., string 220A and string 200B).

Figure 1:
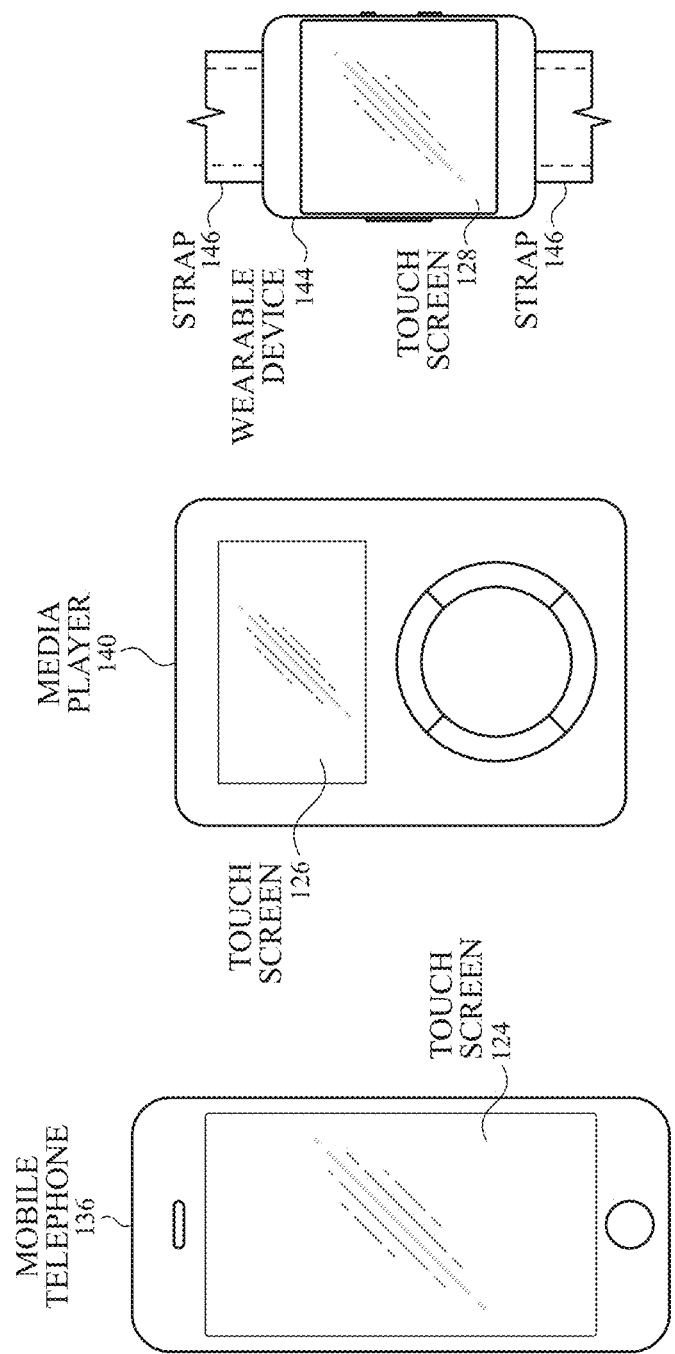
FIGS. 1A-1C illustrate systems in which examples of the disclosure can be implemented.

FIGS. 1A-1C illustrate systems in which examples of the disclosure can be implemented. FIG. 1A illustrates an exemplary mobile telephone 136 that can include a touch screen 124. FIG. 1B illustrates an exemplary media player 140 that can include a touch screen 126. FIG. 1C illustrates an exemplary wearable device 144 that can include a touch screen 128 and can be attached to a user using a strap 146.

Exemplary systems may also include other types of electronic devices such as computers, laptops, tablets, set-top boxes, wireless access points, televisions, and other electronic equipment that may include LEDs. For example, electronic devices may include LEDs in displays that may be used to present visual information and status data and/or may be used to gather user input data (e.g., keyboards, flash LEDs, and/or other components).

The touch screens 124, 126, and 128 can each include a display. A display may include an array of display pixels. Each display pixel may include one or more colored sub-pixels for displaying color images. Each display pixel may include a layer of liquid crystals disposed between a pair of electrodes to control the orientation of the liquid crystals. Controlling the orientation of the liquid crystals can control the polarization of the backlight generated by a backlight unit of the display (which can include the backlight circuit according to examples of the disclosure). This polarization control, in combination with polarizers on opposite sides of the liquid crystal layer, can allow the display to selectively block or selectively allow light at the display pixels.

The backlight unit may include one or more strings of LEDs and an associated backlight circuit that can generate the backlight for the display. The strings of LED(s) may be arranged along one or more edges of a light guide plate that distributes backlight generated by the strings to the LCD unit, or may be arranged to form a two-dimensional grid of LEDs. The backlight circuit can operate (e.g., control) the strings of LEDs.

Figure 2:
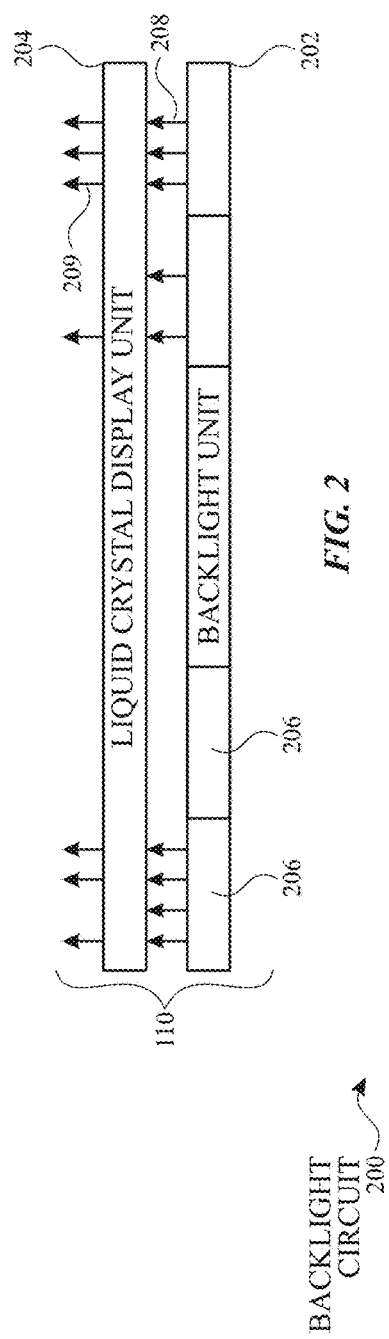
FIG. 2 illustrates a cross-sectional view of a portion of a display according to examples of the disclosure.

FIG. 2 illustrates a cross-sectional view of a portion of a display according to examples of the disclosure. The display 110 can include a backlight unit 202 and a liquid crystal display unit 204. The backlight unit 202 can generate backlight 208 that is emitted in the direction of the liquid crystal display unit 204. The liquid crystal display unit 204 can selectively allow some or all of the backlight 208 to pass through the display pixels therein to generate display light 209 visible to a user. The backlight unit 202 may include one or more subsections 206. In some implementations, the subsections 206 may be elongated subsections that extend horizontally or vertically across some or all of the display 110 (e.g., in an edge-lit configuration for the backlight unit 202). In other implementations, subsections 206 may be square or nearly square subsections (e.g., in a two-dimensional array backlight configuration). The subsections 206 may include one or more strings of LEDs. In some examples, the subsections 206 may be controlled individually for local dimming of backlight 208.

Figure 3:
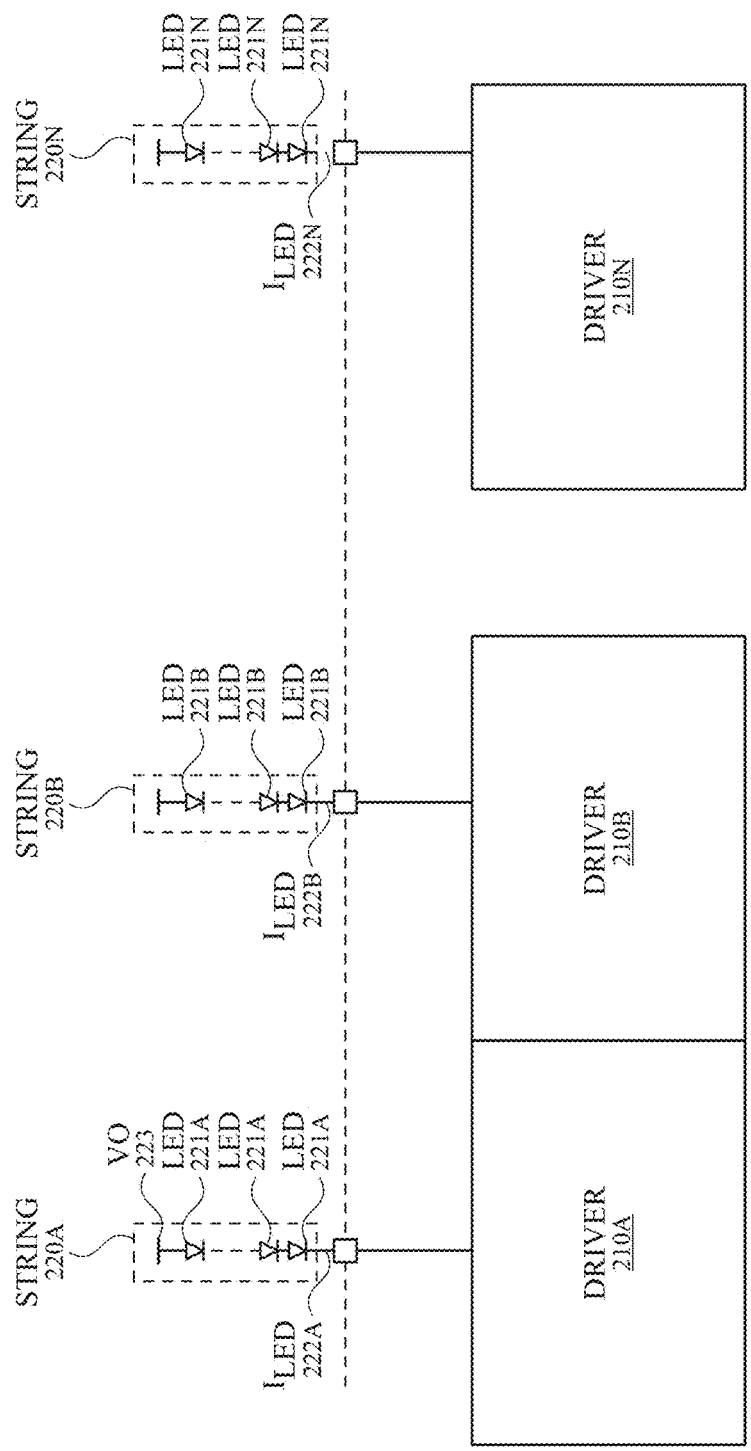
FIG. 3 illustrates a block diagram of a portion of an exemplary backlight circuit including LED drivers according to examples of the disclosure.

FIG. 3 illustrates a block diagram of a portion of an exemplary backlight circuit including LED drivers according to examples of the disclosure. Backlight circuit 200 can be implemented in the backlight unit 202 shown in FIG. 2, for example. The backlight circuit 200 can include a set of strings 220 and a set of drivers 210. As used herein, a set of elements (e.g., strings, drivers, transistors) can include one or more elements.

The set of strings 220 can each include a set of LEDs 221 connected in series. For example, the string 220A can include a set of LEDs 221A connected in series; the string 220B can include a set of LEDs 221B connected in series; and the string 220N can include a set of LEDs 221N connected in series. In some examples, the variable "N" can refer to the total number of strings 220 in the backlight circuit 200.

The LEDs 221 can receive a voltage $V_O$ 223 at a first end of a string from, for example, a DC/DC converter (not shown). In some examples, boost regulators may generate the high voltage for the strings 220 and allow drivers 210 to have sufficient headroom. The LEDs 221 can also be coupled, at a second end of the string 220, in series with a driver 210. Exemplary drivers 210 are discussed in more detail below.

Using multi-string LEDs in a display backlight may be beneficial for certain technologies based on its rated voltage, efficiency, and drive current regulation.

Figure 4A:
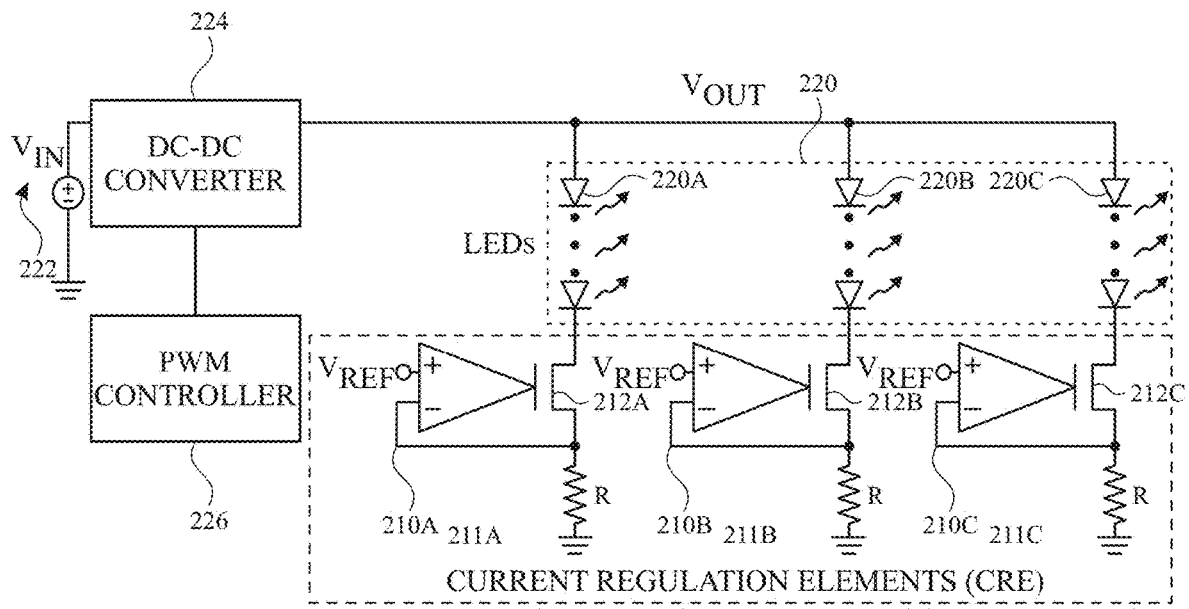
FIGS. 4A and 4B illustrate exemplary partial schematic representations of current drivers for LED strings according to examples of the disclosure.
Figure 4B:
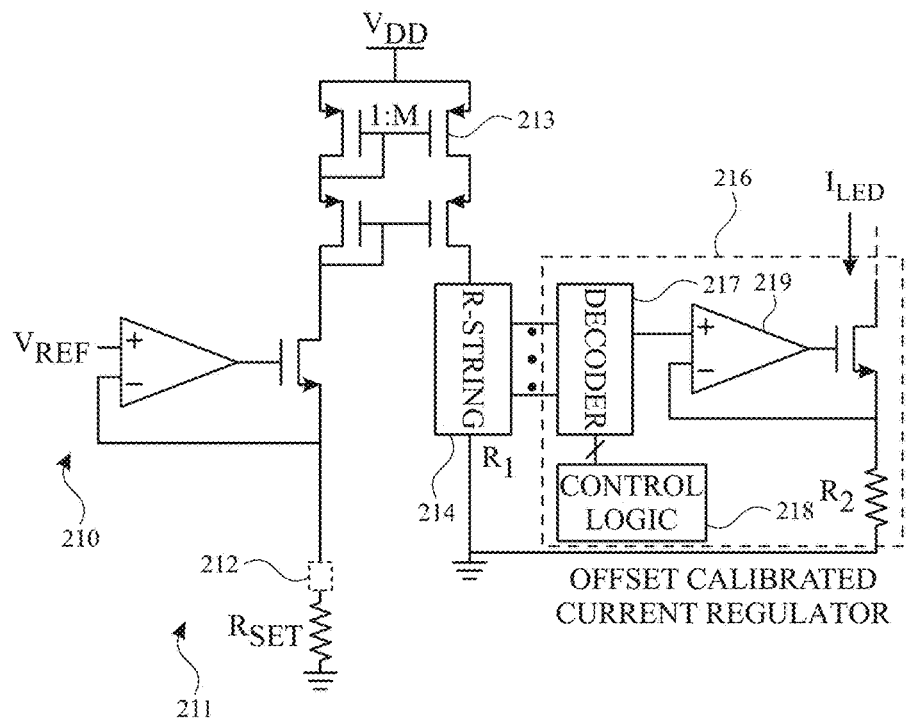

FIGS. 4A and 4B illustrate exemplary partial schematic representations of current drivers for LED strings (e.g., strings 220A through 220N in FIG. 3) according to examples of the disclosure. In the illustrated example of FIG. 4A, a first LED string 220A can have a corresponding current driver 210A. In some examples, the current driver 210A can comprise an operational amplifier with a non-inverting input coupled to a reference voltage $V_{REF}$, an output voltage coupled to the gate of a current driving transistor 212A, and a non-inverting input coupled to the source of the current driving transistor. A load resistance 211A can be coupled between the source of the current driving transistor 212A and ground. In some examples, the resulting current for the LED string 220A can be approximately equal to $V_{REF}/R$, where R is the value of load resistor 211A. Accordingly, by adjusting the voltage $V_{REF}$, the current through LED string 220A can be adjusted based on a linear relationship. In the illustrated example of FIG. 4A, each of the LED strings (e.g., 220A, 220B, and 220C) can have a corresponding current driver (e.g., 210A, 210B, and 210C) that can be used to provide the driving current for each respective LED string. The configuration of FIG. 4A further includes a DC-DC converter 224 that can be used to produce a voltage $V_{OUT}$.

In some instances, LED current accuracy error and channel-to-channel mismatch may be caused by MOSFET mismatch, resistor mismatch, and amplifier offset mismatch in the current drivers illustrated in FIG. 4A. In the illustrated example of FIG. 4B, a driver 216 can include a decoder 217 and control logic 218 to reduce amplifier offset and improve matching (e.g., current mismatch) between the LED strings. For example, while a LED string (not shown) is driven, the non-inverting input of the amplifier 219 in driver 216 may ideally be driven at $V_{REF}$. Due to the offsets, a voltage different from $V_{REF}$ may be required to drive the amplifier in driver 216 to reduce the mismatches. In some examples, in response to detecting a mismatch associated with LED, control logic 218 can control the decoder 217 to output a voltage to the non-inverting input of the amplifier in driver 216 and reduce the mismatch For example, if LED needs to be reduced, e.g., to reduce a mismatch, the voltage to the non-inverting input of the amplifier in driver 216 can be reduced using the circuit illustrated in FIG. 4B (e.g., using decoder 217 and control logic 218).

Figure 5A:
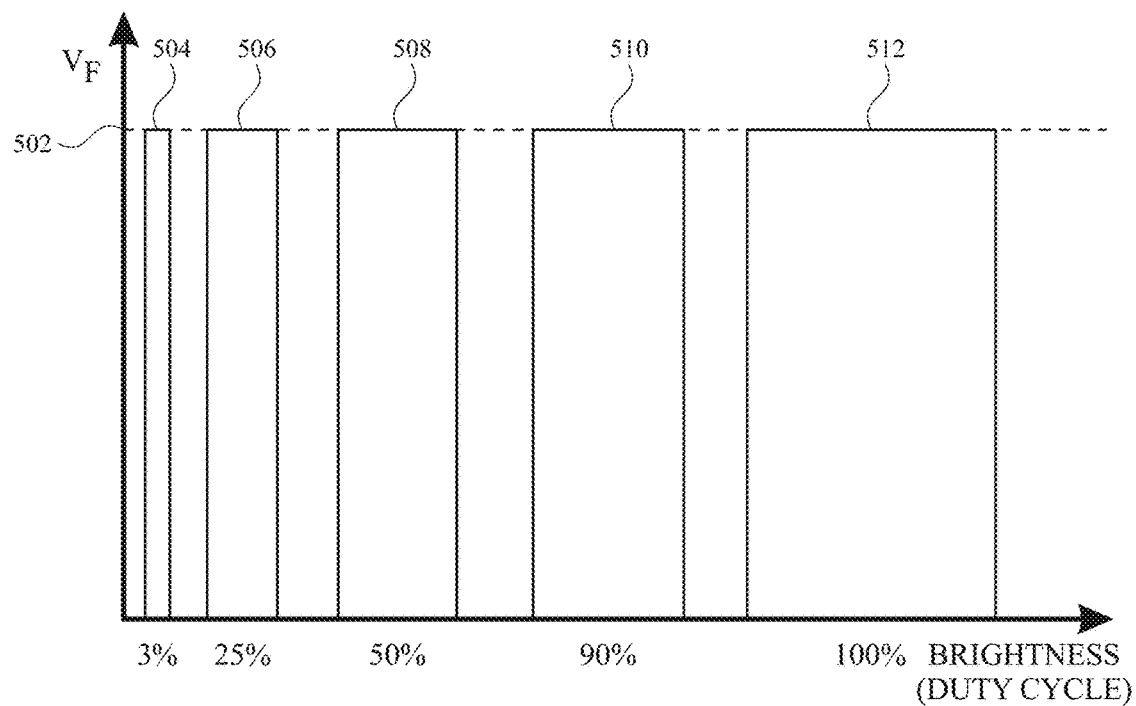
FIG. 5A illustrates an exemplary pulse width modulation (PWM) current driving scheme for a set of LED strings according to examples of the disclosure.

FIG. 5A illustrates an exemplary pulse width modulation (PWM) driving scheme for a set of LED strings (e.g., 220A through 220N in FIG. 3) according to examples of the disclosure. In the illustrated pulse width modulation scheme for providing a LED drive current of FIG. 5A, brightness can be controlled by adjusting a duty cycle of a rectangular pulse having a fixed amplitude of $V_F$. The x-axis of the graph in FIG. 5A illustrates exemplary duty cycles. In some examples, the duty cycle may be related to a brightness level. As one example, the width pulse 504 can correspond to a duty cycle of 3%, and the widths of pulses 506, 508, 510, and 512 can correspondingly increase to represent 25%, 50%, 90%, and 100% duty cycles, respectively. As should be understood by a person of skill in the art, the waveform presented in FIG. 5A is presented in a relative fashion, and does not directly represent signal durations of a PWM signal. Specifically, while each of the pulses 506, 508, 510 and 512 in FIG. 5A appears to be followed by a low signal duration that is approximately equal, a person of ordinary skill would recognize that in a PWM scheme, the signal low duration can be equal to the difference between the period of the PWM signal and the signal high duration of the PWM signal (e.g., if a pulse has a 90% duty cycle, the signal high duration would be 90% of the period, and the signal low duration would be 10% of the period). As another example, for a 100% duty cycle (e.g., corresponding to pulse 512), the PWM signal may stay in a high signal state and not return to a low signal state until a different duty cycle for the PWM signal is selected.

Figure 5B:
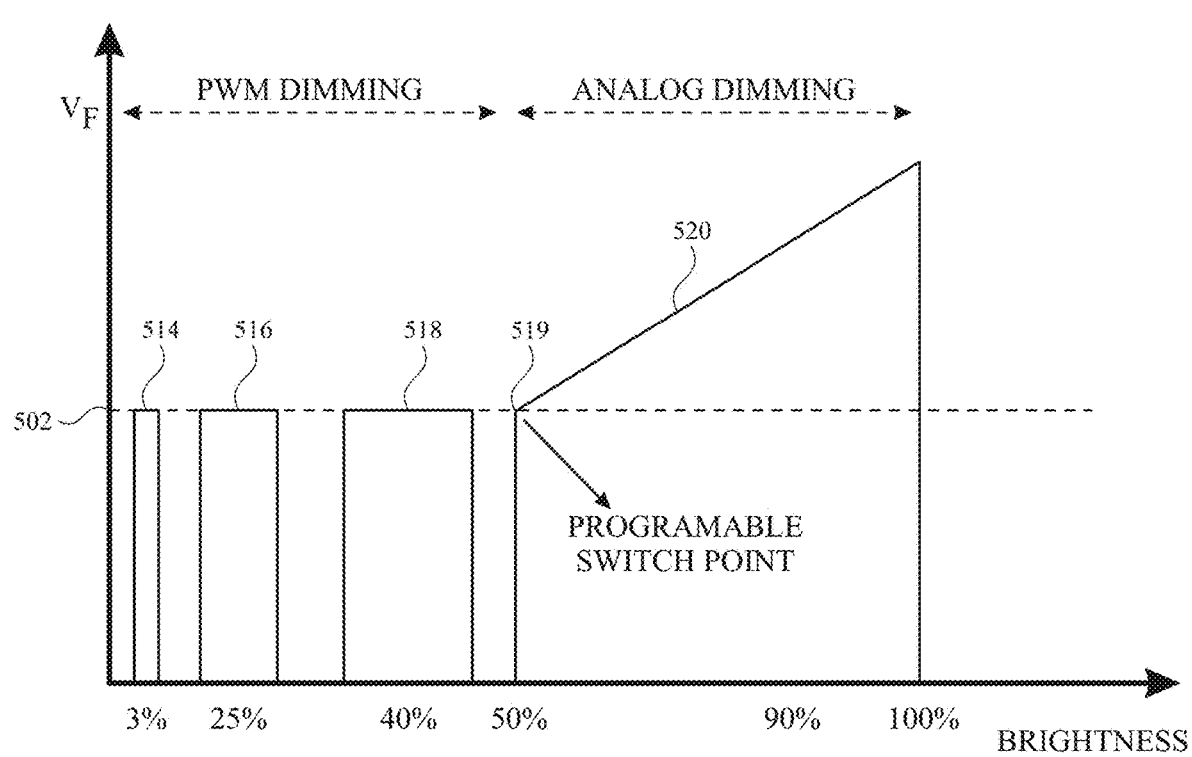
FIG. 5B illustrates an exemplary mixed-mode current driving scheme for a set of LED strings according to examples of the disclosure.

FIG. 5B illustrates an exemplary mixed-mode current driving scheme for a set of LED strings according to examples of the disclosure. In the exemplary scheme, for light output levels below a programmable switch point 519, the mixed-mode driving scheme can utilize a PWM driving scheme, as described above with reference to FIG. 5A. In some examples, during the PWM dimming mode, the voltage level of $V_{REF}$ can be set to a reference value that provides a desired light output level range over the range of duty cycles used in the PWM dimming mode. For example, where the switching point between PWM dimming mode and analog dimming mode is at the midpoint of the dimming range, the 50% dimming range control input can correspond to a 100% duty cycle of the $V_{PWM}$ signal at a voltage $V_F$ as indicated by the dashed line 502. In some examples, for light output levels above the programmable switch point 519, the mixed-mode driving scheme can utilize an analog driving scheme as described herein and as will be further discussed in connection with the examples of FIGS. 7-12 below. For example, for light output levels above the programmable switch point 519, the voltage level of $V_{REF}$ (e.g., a biasing voltage of a LED current) can be greater than the voltage $V_F$ to provide a desired light output level. In some examples, for light output levels above the programmable switch point 519, both analog dimming and PWM dimming are utilized to control a corresponding LED current. For example, a control signal that utilizes both analog dimming and PWM dimming techniques can have a duty cycle less than 100% and a voltage above $V_F$.

In some examples, the programmable switch point 519 can be selected as a mid-scale value of the maximum desired output level. In some examples, the programmable switch point 519 can be selected to provide a desired resolution light output level control that can depend on an available bit depth of an analog dimming control signal. In some examples, the programming switch point 519 can be selected to meet system power requirements.

It should be understood that the pulse widths illustrated in FIGS. 5A and 5B are not intended to be shown to scale and are provided as a way to illustrate the concept of pulse width modulation and/or analog dimming based brightness control. It is understood that, for simplicity and convenient graphical depictions, the complete waveforms are not shown in the figure.

Figure 6:
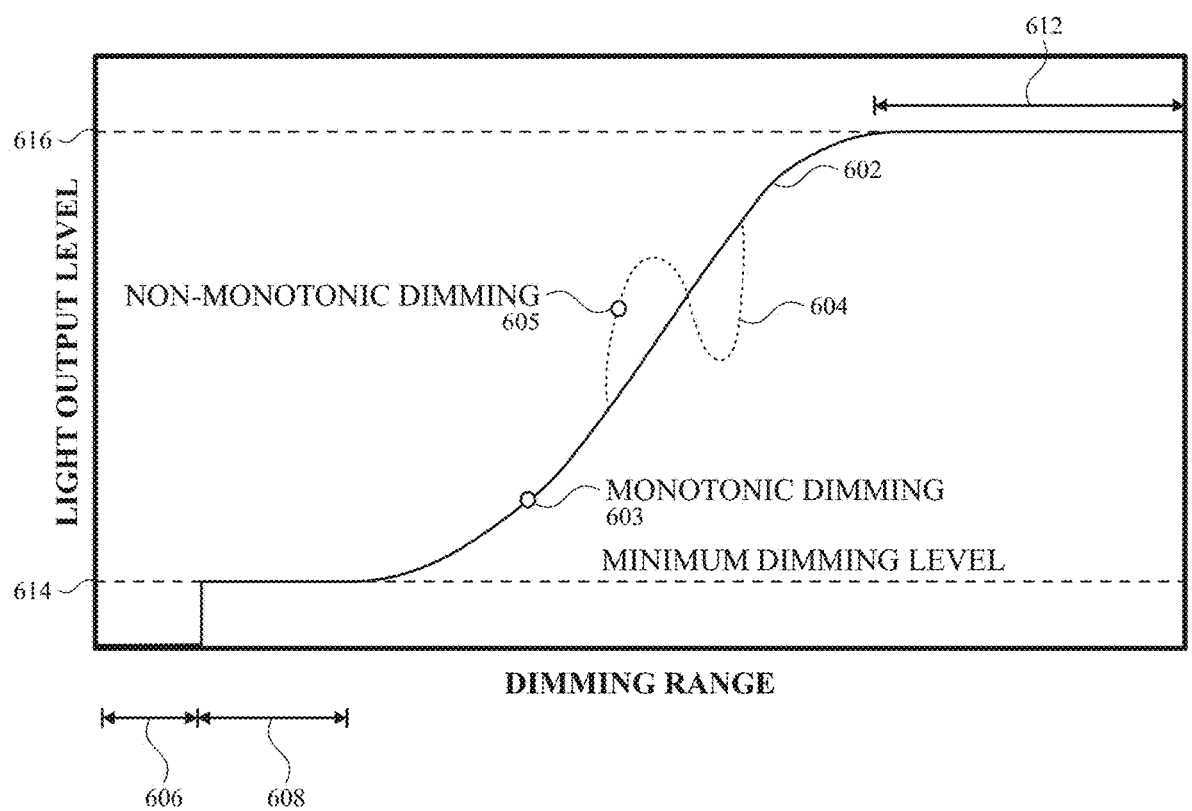
FIG. 6 illustrates exemplary dimming curve and exemplary dimming curve characteristics that can affect light output levels according to examples of the disclosure.

FIG. 6 illustrates exemplary dimming curve and exemplary dimming curve characteristics that can affect light output levels according to examples of the disclosure. The illustrated graph shows a light output level plotted against a dimming range (e.g., against an input current or voltage value). FIG. 6 includes a monotonic curve 602 and a non-monotonic curve 604 having a non-monotonic region 605 between a minimum dimming level 614 and a maximum dimming level 616. In some examples, there can be several dead zones 606, 608, and 612 where light output level can remain unchanged regardless of changes to dimming control (e.g., dead travel). For example, for a voltage controlled dimming, the region 606 can represent a range of voltages where no light output is provided (e.g., voltages below a diode threshold voltage, voltages below a driving transistor threshold voltage, etc.). Similarly, the region 608 can represent a range of voltages where the output light level is fixed at the minimum light output level of the LEDs. Finally, the region 612 can represent a saturated region where the light output level can be limited to the maximum output level (e.g., further increases in voltage provide no additional light). For the monotonic dimming curve 602 outside of the regions 606, 608, and 612, the light output level ideally increases as the dimming range input increases. In contrast to the monotonic curve 602, in an ideal situation, exemplary non-monotonic dimming curve 604 includes a region where some increases in dimming range input can result in a decrease in light output level. In some examples, the non-monotonic dimming characteristic can cause fluctuations in the light output level that do not correspond to the desired output level. For example, as the dimming range input increases from the point 605 on the non-monotonic dimming curve 604, the light output level can begin to decrease for a portion of the curve. This behavior can occur, in one example, when an analog dimming scheme utilizing a digital-to-analog converter (DAC) is used and the most significant input bits to the DAC undergo a change (e.g., switching input from 0111 to 1000 in a 4-bit DAC).

It should be understood that although some examples are presented in the context of voltage control for the dimming range, control of dimming based on current control can work analogously and include analogous operation regions to those discussed above. In some examples, it can be desirable to provide an illumination scheme that has monotonic dimming across the entire desired light output level range, regardless of whether the dimming is based on PWM dimming control or analog dimming control. Accordingly, examples of the disclosure discussed herein, describe dimming configurations that can provide monotonic dimming across the entire desired output level range.

Figure 7:
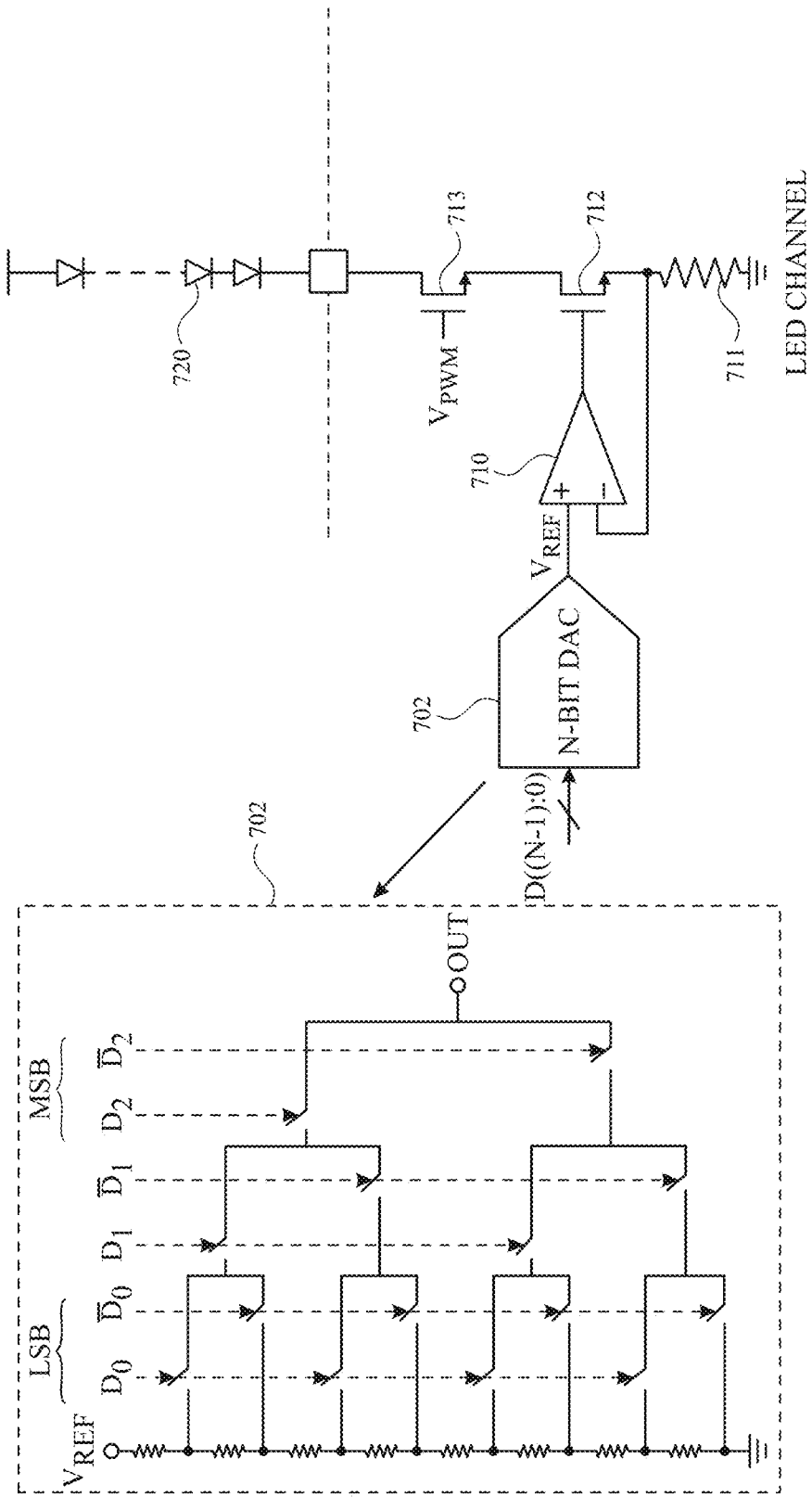
FIG. 7 illustrates an exemplary mixed-mode LED driver configuration utilizing a DAC for analog dimming according to examples of the disclosure.

FIG. 7 illustrates an exemplary mixed-mode LED driver configuration utilizing a DAC for analog dimming according to examples of the disclosure. In the illustrated example, two separately controllable input signals $V_{PWM}$ and $V_{REF}$ are provided and can each serve as a dimming range control input (e.g., as described above with regard to FIGS. 5A, 5B, and 6). In the example of FIG. 7, the dimming range control input $V_{REF}$ can be input into an operational amplifier 710 with a load resistor 711 and a current drive transistor 712 that can act as a current regulation element similar to those shown in FIG. 4A (e.g., resistors 211A, 211B, and 211C setting the magnitude of a respective LED drive current). In some examples, $V_{REF}$ can be used as an analog dimming range control input to control the light output level of LED string 720 in an analog dimming mode. In addition, in some examples, $V_{PWM}$ can be used as a PWM dimming range control input. $V_{PWM}$ can be input into a transistor 713 in series with the current drive transistor 712. In some examples, the PWM dimming range control input $V_{PWM}$ can be input into a PWM control transistor 713 to control the light output level of LED string 720 in a PWM dimming mode (e.g., as described with regard to FIGS. 5A and 5B). The PWM dimming range control input $V_{PWM}$ can cause current to flow through the LED string 720 during an "on" portion of the PWM cycle (e.g., signal high duration), and the light output level of the LED string can be determined based on the duty cycle of the $V_{PWM}$ signal. In some examples, during the analog dimming mode, $V_{PWM}$ can be set to a bias voltage that permits current to flow through transistor 713. In some examples, the bias voltage can be equal to the $V_{PWM}$ voltage level during the "on" portion of the PWM cycle. In some other examples, the bias voltage can be different from the $V_{PWM}$ voltage level during the "on" portion of the PWM cycle. In some examples, during the PWM dimming mode, the voltage level of $V_{REF}$ can be set to a reference value (e.g., $V_F$, as described with regard to FIG. 5A) that provides a desired light output level range over the range of duty cycles used in the PWM dimming mode. For example, where the switching point between PWM dimming mode and analog dimming mode is at the midpoint of the dimming range, the 50% dimming range control input can correspond to a 100% duty cycle of the $V_{PWM}$ signal at a voltage $V_F$ (e.g., as indicated by the dashed line 502 in FIG. 5B).

In some examples, the DAC 702 can include a set of resistors in series and a set of switches, as illustrated in the figure. The DAC 702 can output a range of voltages from zero to $V_{REF}$. The output voltage can be determined by a voltage divider created by selectively coupling a subset of a set of resistors between $V_{REF}$ and/or ground. For example, a digital input of 111 can cause the switches to couple the top-most resistor between $V_{REF}$ and the output, effectively providing $V_{REF}$ as the output voltage. As another example, a digital input of 000 can cause the switches to couple the output to ground, effectively providing zero as the output voltage. As another example, a digital input between 000 and 111 can cause the switches to create a voltage divider at the output, effectively providing a voltage between zero and $V_{REF}$ to the output. In some examples, the number of possible voltage output values can be determined by the resolution of the DAC (e.g., more switches or more resistors can result in a higher resolution). Therefore, more die area (e.g., to accommodate the additional resistors and/or switches) may be needed to achieve a higher DAC resolution. Although FIG. 7 illustrates a voltage divider implementation of the DAC, it is understood that the DAC can be implemented similarly with a current divider.

Figure 8:
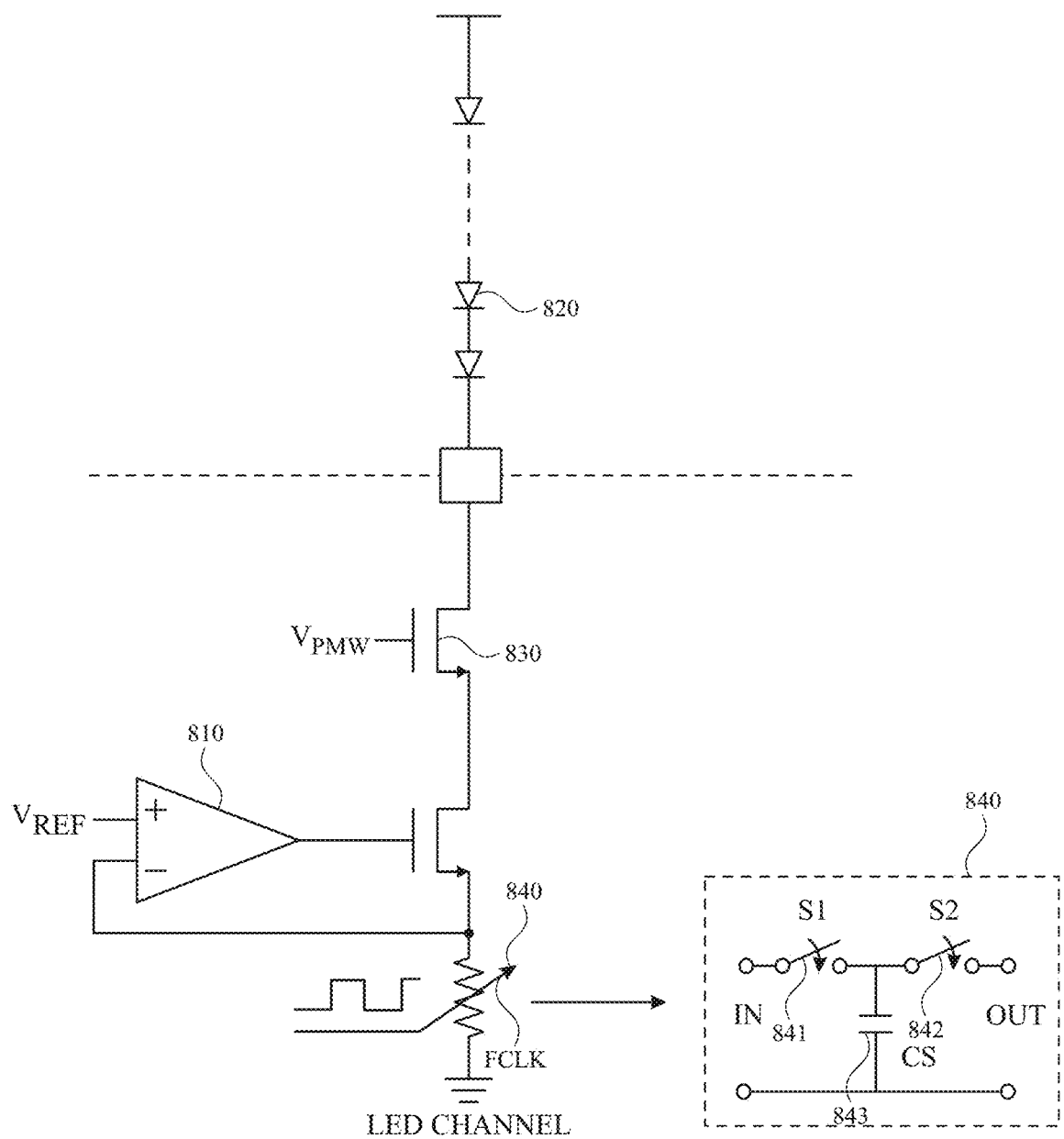
FIG. 8 illustrates an exemplary mixed-mode LED driver configuration utilizing a switched-capacitor resistor based load to provide frequency controlled dimming according to examples of the disclosure.

FIG. 8 illustrates an exemplary mixed-mode LED driver configuration utilizing a switched-capacitor resistor based load to provide frequency controlled dimming according to examples of the disclosure. Similar to the architecture shown in FIG. 7, a transistor 830 (which can correspond to transistor 713 above) can receive a PWM control signal $V_{PWM}$ that can provide light output level control of LED string 820 (which can correspond to LED 720 above or any LED strings described herein) during a PWM dimming mode as described above.

In addition to the PWM control signal for performing PWM dimming, the mixed-mode LED driver configuration of FIG. 8 can utilize a switched-capacitor resistor circuit 840 to perform analog dimming of the LED string 820. In the specific switched-capacitor resistor circuit 840 shown in FIG. 8, the effective resistance of the switched-capacitor resistor circuit can vary inversely proportionally to the frequency of the switching control input signal $F_{CLK}$ (e.g., $R=1/(C_S*F_{CLK})$). It should be understood that the amplifier 810 in conjunction with the switched-capacitor resistor 840 share a similar topology to the driver 210A and load resistor 211A, as discussed above in conjunction with FIG. 4A. As explained above with regards to the drivers 210A-210C above in FIG. 4A, the current through the resistor 840 can be approximately equal to $V_{REF}/R$ where R is the resistance value of the switched-capacitor resistor. Accordingly, the current through the LED string 820 can be proportional to the frequency of the signal $F_{CLK}$ (e.g., $I_{LED}=V_{REF}*C_S*F_{CLK}$). In some examples, in order to provide sufficient drive current to drive a LED string of a display, the switched capacitor circuit can require a large capacitance value that can consume a large amount of area in an integrated circuit implementation. In some examples, the switched-capacitor resistor 840 can be provided on a separate integrated circuit (e.g., away from the die) from the driver circuits. In some examples, the PWM control signal $V_{PWM}$ can be generated by a phase locked loop, and the duty cycle can be varied to perform PWM dimming in the PWM dimming mode. In some examples, the signal $F_{CLK}$ can be generated by a separate frequency generator. Compared to using a DAC, such as the one described with respect to FIG. 7, using a switched-capacitor resistor to control analog dimming can reduce the chip area, reduce design complexity, increase monotonicity, increase accuracy, and increase linearity.

In some examples, it can be advantageous to utilize the phase locked loop (PLL) used for generating the PWM control signal to also generate the signal $F_{CLK}$. In particular, one advantage of having shared hardware for providing both the PWM control signal $V_{PWM}$ and the signal $F_{CLK}$ can be a substantial savings of chip area and power due to reuse of components. Other advantages of using the same PLL to generate the PWM control signal and signal $F_{CLK}$, as described herein, can be simplified design complexity, increased monotonicity, increased accuracy, and increased linearity.

Figure 9:
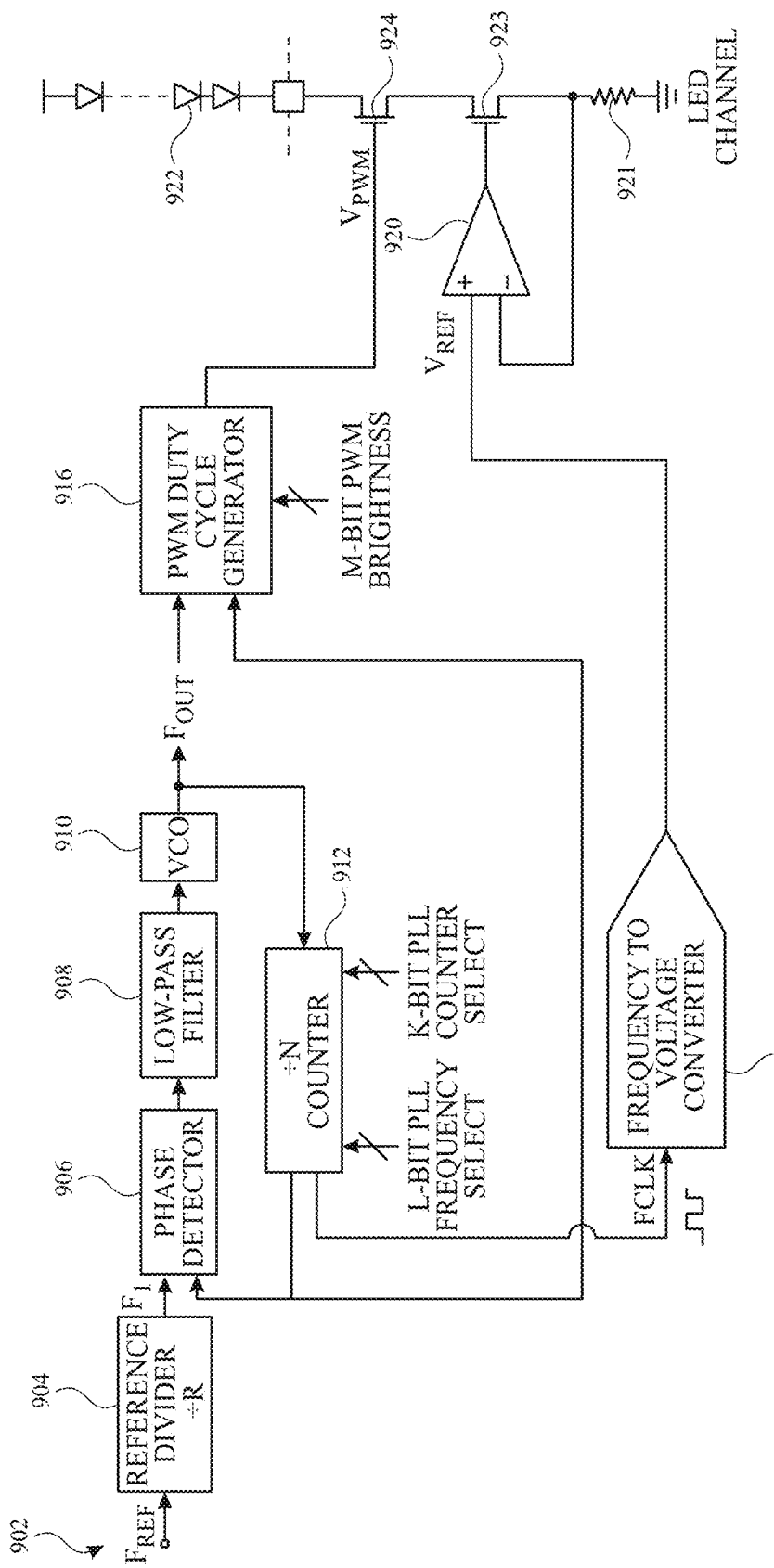
FIG. 9 illustrates an exemplary mixed-mode LED driver configuration utilizing a phase locked loop (PLL) for PWM dimming control and frequency-to-voltage converter for analog dimming control according to examples of the disclosure.

FIG. 9 illustrates an exemplary mixed-mode LED driver configuration utilizing a common PLL for PWM dimming control and frequency-to-voltage converter for analog dimming control according to examples of the disclosure. The mixed-mode LED driver configuration can include a frequency-to-voltage converter 914 and a current regulation element comprising operational amplifier 920, a driving transistor 923, and a load resistor 921, which can be understood from the above explanation of driver 210A and load resistor 211A in the context of FIG. 4A. The components described above can be used to provide analog dimming control of the light output level of LED string 922 during an analog dimming mode of the mixed-mode LED driver. In some examples, the PWM control transistor 924 (e.g., corresponding to PWM control transistors 713 and 830 above) can be used to control light output levels of the LED string 922 in a PWM control mode, as can be understood from the disclosure above.

A PLL can be used to generate both a PWM control signal $V_{PWM}$ and a variable frequency control signal $F_{CLK}$ for both the PWM control mode operation and the analog control mode operation. The PWM control signal $V_{PWM}$ can be coupled to the PWM control transistor 924, and the variable frequency control signal $F_{CLK}$ can be coupled to the frequency-to-voltage converter 914. In some examples, the PLL can include elements 902, 904, 906, 908, 910, and 912, as will be described in more detail below. It should be understood that the exact configuration of a PLL can vary from the described configuration without departing from the scope of the present disclosure. In some examples, reference divider 904 can accept a reference frequency $F_{REF}$ and produce a frequency $F_1$ that can be input into a first input of phase detector 906. In some examples, a signal having a reference frequency $F_{REF}$ can be inputted to the first input of the phase detector 906 without the reference divider. In some examples, the output of the phase detector can be input into a low-pass filter 908, and an output of the low-pass filter can be input into a Voltage Controlled Oscillator (VCO) 910. In some examples, the output from the VCO 910 can be coupled to a first input of a PWM duty cycle generator 916 and a divide-by-N counter 912. In some examples, the VCO output signal can have a frequency Fout. In some examples, a first divide-by-N counter 912 output can also be connected to a second input of the phase detector 906 (e.g., $F_{OUT}$ is feedback to the phase detector 906) and a second input of the PWM duty cycle generator 916. In some examples, the PLL is configured such that the signals input to the phase detector 906 have the same frequency and a constant phase difference over time. In some examples, the PWM duty cycle generator 916 can output a signal having a frequency of either one of its inputs (e.g., $F_{out}$ or $F_1$). In some examples, an output from a second divide-by-N counter 912 can also be connected to a reference signal generator (e.g., frequency to voltage converter 914). In some examples, the first and second outputs can output signals that have different frequencies relative to $F_{OUT}$; that is, the number "N" may be different between the two inputs. For example, the feedback signal or the input frequency has a frequency of $F_{OUT}$ divided by $N_1$, and $F_{CLK}$ is $F_{OUT}$ divided by $N_2$. $N_1$ and $N_2$ may be positive integers. In some examples, $N_1$ can be selected (e.g., using K-bit PLL counter select control signal) based on a desired PWM control signal frequency, such that $F_{OUT}=F_1*N_1$. In some examples, $N_2$ can be selected (e.g., using L-bit PLL frequency select control signal) based on a desired clock frequency to a reference signal generator (e.g., switched-capacitor resistor 840, frequency-to-voltage converter 914, frequency-to-current converters 1026 and 1110), such that $F_{CLK}=F_{out}/N_1$. In some examples, the desired clock frequency is based on a desired LED current amplitude; the desired frequency causes the reference signal generator to generate a reference signal (e.g., reference current, reference voltage) for the driver to drive the desired LED current.

In some examples, PWM duty cycle control for the PWM duty cycle generator 916 can be provided with a M-bit wide PWM brightness control signal. For example, $2^M$ different duty cycles can be generated with the PWM duty cycle generator. In some examples, the divide-by-N counter can include a K-bit PLL counter select control signal that can be used to provide output frequencies that are greater than the input frequency of the PLL $F_1$ (e.g., $F_1$ can be multiplied by $2^K$ different values to generate $2^K$ possible Four frequencies).

In some examples, the divide-by-N counter 912 can include a L-bit PLL frequency select control signal that can be used to control the $F_{CLK}$ frequency for the analog dimming mode. For example, the $2^L$ different $F_{CLK}$ can be derived with from $F_{out}$; $F_{out}$ can be divided by $2^L$ different linearly-spaced values to generate $2^L$ possible $F_{CLK}$ frequencies. In some examples, using the frequency-to-voltage converter 914, $2^L$ possible $V_{REF}$ values can be converted from the $2^L$ possible $F_{CLK}$ frequencies. In some examples, the relationship between input and output of the frequency-to-voltage converter 914 is linear. In such instances, the $2^L$ possible $V_{REF}$ values may be linearly distributed.

Accordingly, as should be understood from the above, the PLL can be used as a shared component for both frequency control of the $F_{CLK}$ signal to the frequency-to-voltage converter 914 in an analog dimming mode and for duty cycle control of the $V_{PWM}$ signal during a PWM dimming mode as can be understood from the examples above, in particular with regard to FIG. 7. Additionally, as shown with respect to FIG. 9, linear and more monotonic frequency-to-voltage conversion can be achieved by employing a linear frequency-to-voltage converter circuit (e.g., frequency-to-voltage converter 914), the PLL, and the divided-by-N counter 912. In some examples, using a linear frequency-to-voltage converter can eliminate the need for a high-resolution DAC (e.g., DAC 702 that includes a high resistor and switch count). Eliminating the need for a high-resolution DAC can reduce chip area. In some examples, the number of bits of the L-bit PLL frequency select control signal can determine the resolution of $V_{REF}$ (e.g., the higher L is, the more possible values of $V_{REF}$ there are). In some instances, due to the conversion from frequency to analog domain, the dynamic range of the LED current drivers can be extended.

Figure 10:
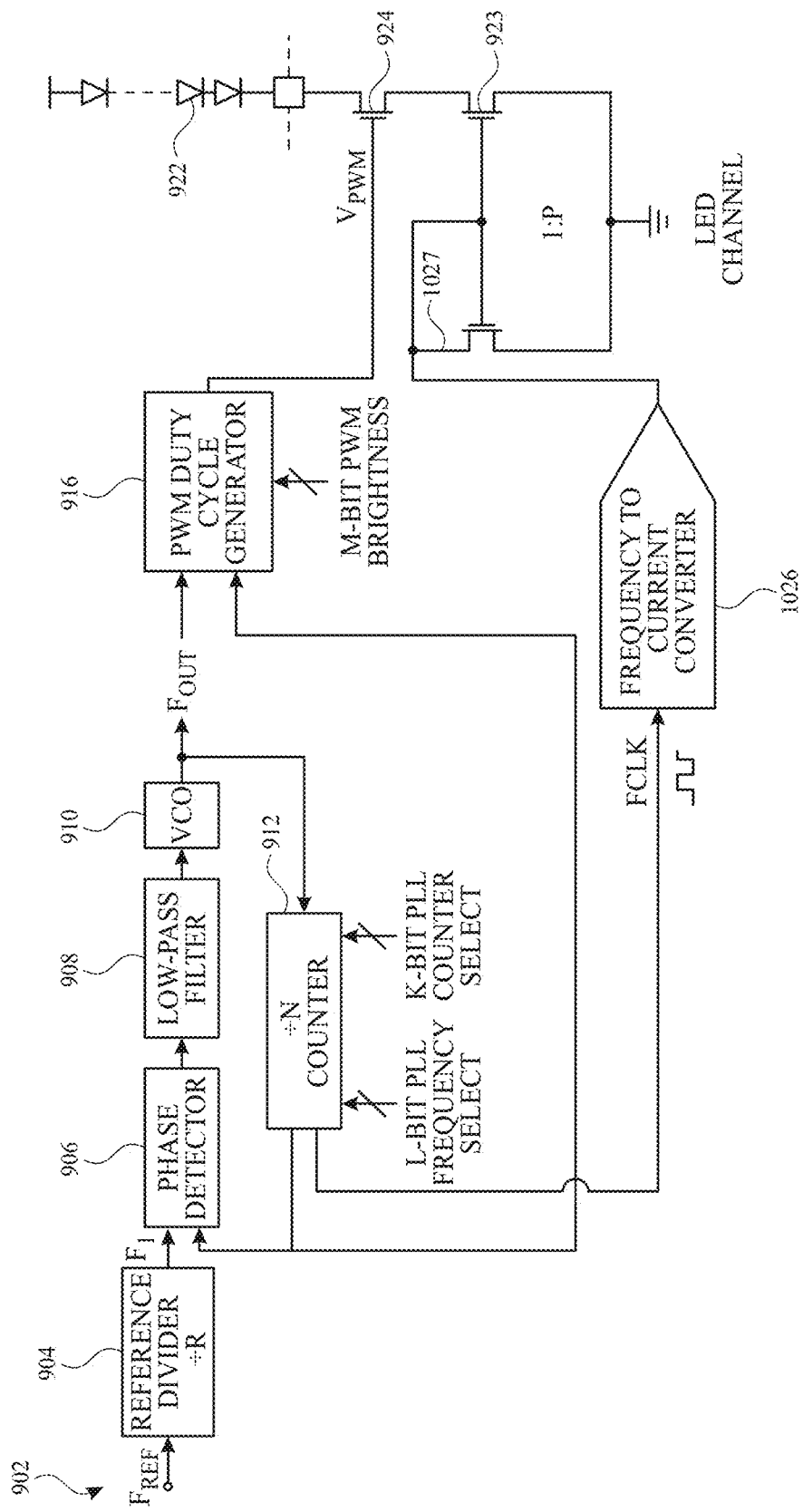
FIG. 10 illustrates an exemplary mixed-mode LED driver configuration utilizing a common PLL for PWM dimming control and frequency-to-current converter for analog dimming control according to examples of the disclosure.

FIG. 10 illustrates an exemplary mixed-mode LED driver configuration utilizing a common PLL for PWM dimming control and frequency-to-current converter for analog dimming control according to examples of the disclosure. The configuration in FIG. 10 may be corresponding similar to that of FIG. 9, including identical components 902, 904, 906, 908, 910, 912, and 916, as described above. The configuration of FIG. 10 may differ from that of FIG. 9 in that frequency-to-current converter 1021 may replace the frequency-to-voltage converter 914, and the current regulation element formed from operational amplifier 920 and load resistor 921 can be replaced by a current mirror 1027. In some examples, the drive transistor 923 can be sized P-times wider than the reference transistor of the current mirror, where P is a positive number. In this manner, the LED current can be P-times the current generated from the frequency-to-current converter 1021. Similar to the configuration described in FIG. 9, the PLL can be used as a shared component for both frequency control of the $F_{CLK}$ signal to the frequency-to-current converter 1026 in an analog dimming mode and for duty cycle control of the $V_{PWM}$ signal during a PWM dimming mode as can be understood from the examples above, in particular with regard to FIG. 7.

In some examples, similar to FIG. 9, the divide-by-N counter 912 can include a L-bit PLL frequency select control signal to generate $2^L$ possible $F_{CLK}$ frequencies. In some examples, using the frequency-to-current converter 1026, $2^L$ possible reference current values (e.g., reference current of the current mirror) can be converted from the $2^L$ possible $F_{CLK}$ frequencies (e.g., $2^L$ different values over the curve illustrated in FIG. 12B). In some examples, the relationship between input and output of the frequency-to-current converter 1026 is linear; therefore, the $2^L$ possible reference current values are linearly distributed.

As shown with respect to FIG. 10, linear and more monotonic frequency-to-current conversion can be achieved by employing a linear frequency-to-current converter circuit (e.g., frequency-to-current converter 1026), the PLL, and the divided-by-N counter 912. In some examples, using a linear frequency-to-current converter can eliminate the need for a high-resolution DAC (e.g., DAC 702 that includes a high resistor and switch count). Eliminating the need for a high-resolution DAC can reduce chip area. In some examples, the number of bits of the L-bit PLL frequency select control signal can determine the resolution of the reference current (e.g., the higher L is, the more possible values of the reference current there are). In some instances, due to the conversion from frequency to analog domain, the dynamic range of the LED current drivers can be extended.

Figure 11:
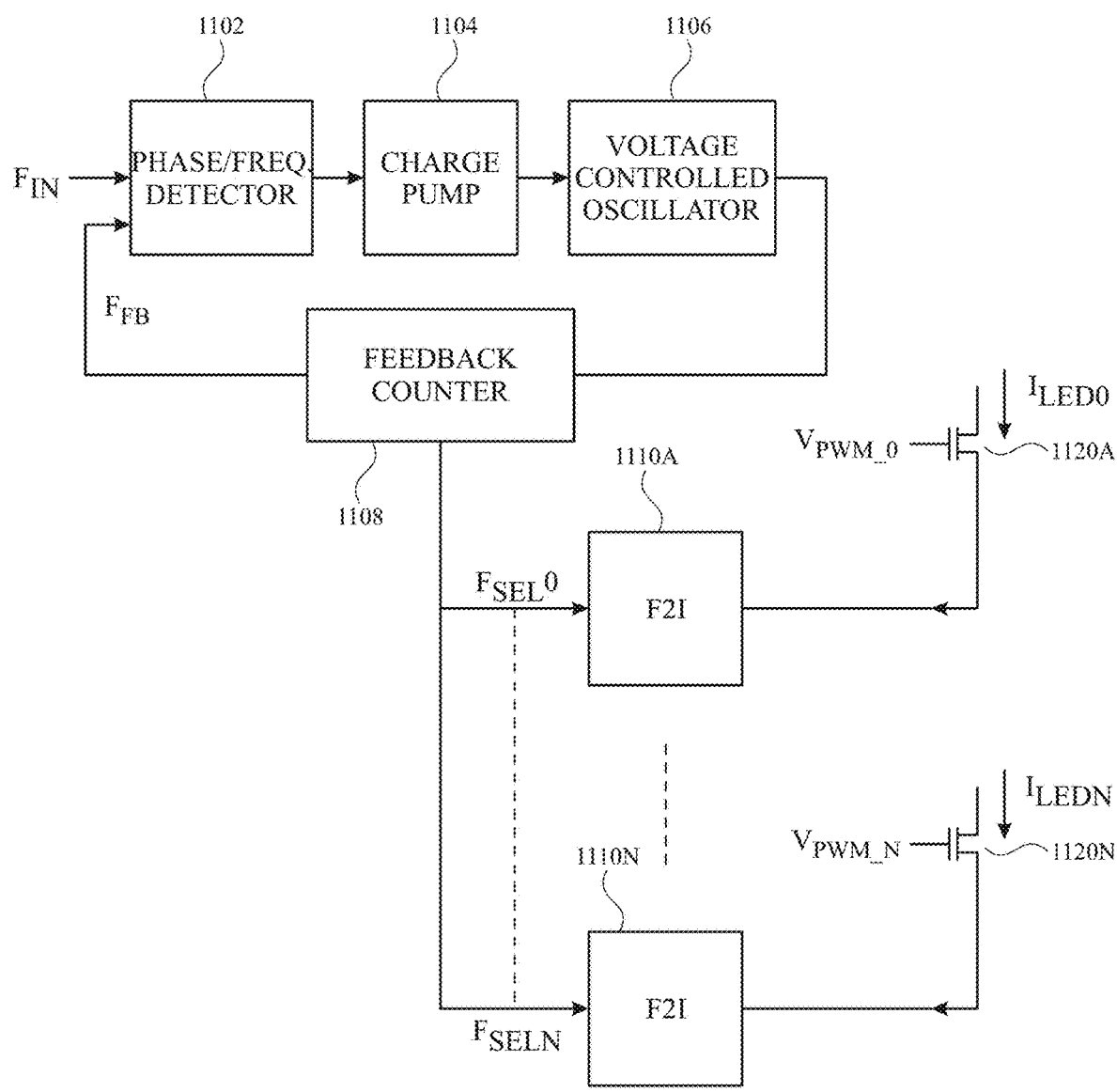
FIG. 11 illustrates an exemplary illustrates a block diagram of a portion of an exemplary LED drive circuit including a phase locked loop and frequency-to-current converters according to examples of the disclosure.

FIG. 11 illustrates an exemplary block diagram of a portion of an exemplary LED drive circuit including a phase locked loop and frequency-to-current converters according to examples of the disclosure. In the example of FIG. 11, a PLL can include a phase/frequency detector 1102, a charge pump 1104, a voltage controlled oscillator 1106, and a feedback counter 1108. The phase/frequency detector 1102 can receive as inputs an input frequency $F_{IN}$ and a feedback frequency $F_{FB}$ produced as a first output of the feedback counter 1108. The feedback counter can receive, as an input, the output signal produced by the voltage controlled oscillator 1106. A second output (e.g., $F_{SEL0}$ to $F_{SELN}$) of the feedback counter 1108 can be used as a frequency input for frequency-to-current (F2I) converters 1110A through 1110N. The frequency-to-current converters 1110A-1110N can be used to provide light output control (e.g., analog dimming) via transistors 1120A-1120N using currents $I_{LED0}$-$I_{LEDN}$ for N LED strings (not shown), as can be understood from the examples of the present disclosure. In some examples, PWM control signals $V_{PWM\_0}$-$V_{PWM\_N}$ can each be connected to gates of the transistors 1120A-1120N and can control a duty cycle of a respective LED current. In some examples, the PLL and divided-by-N counter 912, as described with respect to FIGS. 9 and 10, can be used to output signals associated with outputs $F_{SEL0}$ to $F_{SELN}$. Although outputs $F_{SEL0}$ to $F_{SELN}$ are illustrated as shorted together, it is understood that $F_{SEL0}$ to $F_{SELN}$ can be output independently, such that the signals of $F_{SEL0}$ to $F_{SELN}$ have different frequencies. Even though the figure shows each driver as coupled to a corresponding frequency-to-current converter, it is understood that in some examples, the number of frequency-to-current converters can be less than N; in these examples, a set of switches can be configured to selectively couple an "on" driver to one of the frequency-to-current converters.

Although the example in FIG. 11 is described with frequency-to-current converters, it is understood that the feedback counter 1108 can couple to other frequency controlled elements for analog dimming. In some examples, a switched-capacitor resistor receiving a $F_{SEL}$ signal, described with respect to FIG. 8, can be used in place of a frequency-to-current converter. In some examples, a frequency-to-voltage converter receiving a $F_{SEL}$ signal, described with respect to FIG. 9, can be used in place of a frequency-to-current converter; in these examples, the frequency-to-voltage converter can couple to a non-inverting input of a corresponding amplifier and a load resistor can couple to a source of a corresponding drive transistor.

Accordingly, the area, linearity, and monotonicity benefits, as described with respect to FIGS. 8, 9, and 10, are also applicable for the N-channels described in FIG. 11.

Figure 12:
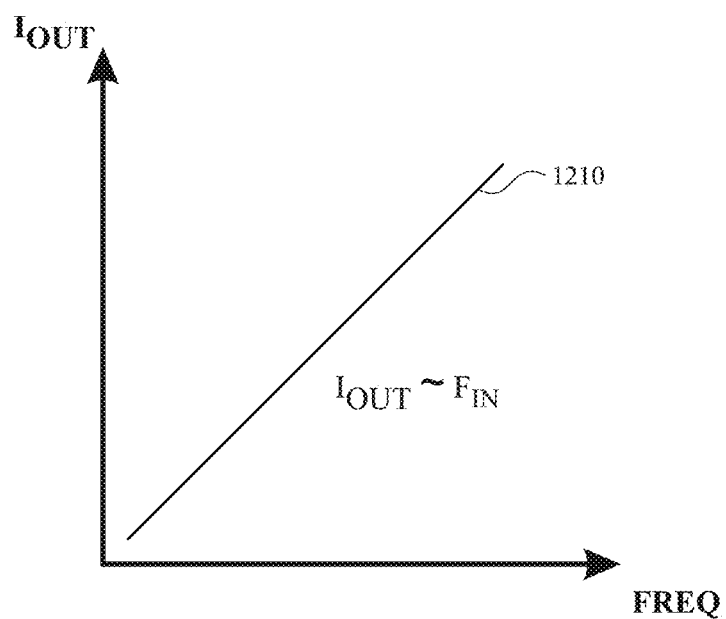
FIG. 12 illustrates an exemplary frequency-to-current profile of an exemplary frequency-to-current converter according to examples of the disclosure.

FIG. 12 illustrates an exemplary frequency-to-current profile of an exemplary frequency-to-current converter according to examples of the disclosure. An output characteristic of a frequency-to-current controller can be linear over an operative range as illustrated by curve 1210. The output characteristic of the exemplary frequency-to-current controller can be monotonic due to the proportional relationship between input frequency $F_{IN}$ and current $I_{OUT}$, assuming a well-behaved frequency source such as a phase locked loops with programmable (or selectable) output frequency, as shown in FIGS. 9-11 above. In some examples, input frequency $F_{IN}$ can be clock frequency $F_{CLK}$ or a $F_{SEL}$ signal, as described with respect to FIGS. 10 and 11. In some examples, $I_{OUT}$ can be proportional to $F_{IN}$, a constant voltage $V_{REF}$ (e.g., voltage at the non-inverting terminal of amplifier 810, reference voltage of an integrator in a linear frequency-to-current converter), and a constant switched-capacitor (e.g., capacitor 843, switched-capacitor of a linear frequency-to-current converter) capacitance $C_S$. Although FIG. 12 illustrates a curve versus frequency plot, it is understood that a similar linear relationship (e.g., output voltage is proportional to input frequency) between voltage and frequency exists for an exemplary frequency-to-voltage converter.

Various functions described above can be implemented in digital electronic circuitry, in computer software, firmware, hardware, or a combination thereof. The techniques can be implemented using one or more computer program products. Programmable processors and computers can be included in or packaged as mobile devices. The processes and logic flows can be performed by one or more programmable processors and by one or more programmable logic circuit. General and special purpose computer devices and storage devices can be interconnected through communication networks.

Some implementations include electronic components, such as microprocessors, storage, and memory that can store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra-density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer," "processor," and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device described herein for displaying information to the user and a keyboard and a pointing device, such as a mouse or a trackball, by which the user can provide input to the computer. Other kinds of devices can be used to provide for interaction with a user as well; for example, feedback provided to the user can be any form of sensory feedback, such as visual feedback, auditory feedback, or tactile feedback; and input from the user can be received in any form, including acoustic, speed, or tactile input.

Many of the above-described features and applications are implemented as software processes that are specified as a set of instructions recorded on a computer readable storage medium (also referred to as a computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, or subroutine, object, or other component suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms or portions of code). A computer program can be deployed to be executed on one computer or on multiple computers that are located at one site or distributed across multiple sites and interconnected by a communication network.

One skilled in the art would understand that any specific order or hierarchy of blocks in the processes disclosed is an illustration of example approaches. Based upon design preferences, one skilled in the art would understand that the specific order or hierarchy of blocks in the processes may be rearranged, or that all illustrated blocks be performed. Some of the blocks may be performed simultaneously. For example, in some instances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein the reference to an element in the singular is not intended to mean "one and only one" unless specifically so stated, but rather "one or more." Unless specifically stated otherwise, the term "some" refers to one or more. Headings and subheadings, if any, are used for convenience only and do not limit the subject disclosure.

The predicate words "configured to," "operable to," "capable of," and "programmed to" do not imply any particular tangible or intangible modification of a subject, but, rather, are intended to be used interchangeably. For example, a processor configured to monitor and control an operation or a component may also mean the processor being programmed to monitor and control the operation, or the processor being operable to monitor and control the operation. Likewise, a processor configured to execute code can be construed as a processor programmed to execute code or operable to execute code.

The word "example" is used herein to mean "serving as an example or illustration." Any aspect or design described herein as "example" is not necessarily to be construed as preferred or advantageous over other aspects or designs.

A circuit is disclosed. In some examples, the circuit comprises: a reference signal generator having a linear input-to-output relationship, the reference signal generator configured to receive a signal having a clock frequency, the clock frequency being an input to the reference signal generator; and generate a reference signal based on the clock frequency of the signal and the linear input-to-output relationship; and a light emitting diode (LED) driver coupled to the reference signal generator, the LED driver configured to: receive the reference signal; and drive a LED current having an amplitude, the amplitude of the LED current based on the reference signal. Additionally or alternatively, in some examples, the circuit further comprises: a phase locked loop (PLL) configured to generate a signal having an output frequency; and a divide-by-N counter coupled to the PLL and the reference signal generator, the divide-by-N counter configured to generate a feedback signal having an input frequency and to generate the signal having the clock frequency, wherein: the input frequency is equal to the output frequency divided by a number $N_1$, the number $N_1$ selected based on a frequency of the LED current; and the clock frequency is equal to the output frequency divided by a number $N_2$, the number $N_2$ is selected based on the generated reference signal. Additionally or alternatively, in some examples, the divided-by-N counter is further configured to receive a K-bit frequency select control signal; the K-bit frequency select control signal is based on the number $N_1$; and the PLL is configured to generate $2^K$ output frequencies. Additionally or alternatively, in some examples, the divided-by-N counter is further configured to receive a L-bit frequency select control signal; the L-bit frequency select control signal is based on the number $N_2$; and the divided-by-N counter is configured to generate $2^L$ clock frequencies. Additionally or alternatively, in some examples, the circuit further comprises a pulse width modulation (PWM) signal generator coupled to the LED driver and configured to: receive the signal having the output frequency; vary a duty cycle of the signal having the output frequency; and produce a PWM control signal having the duty cycle and the output frequency, wherein the PWM control signal controls a duty cycle of the LED current. Additionally or alternatively, in some examples, the reference signal is a reference voltage; and the reference signal generator is a frequency-to-voltage converter, the frequency-to-voltage converter configured to generate the reference voltage based on the linear input-to-output relationship. Additionally or alternatively, in some examples, the reference signal is a reference current; and the reference signal generator is a frequency-to-current converter, the frequency-to-current converter configured to generate the reference current based on the linear input-to-output relationship. Additionally or alternatively, in some examples, the circuit further comprises a current mirror coupled to the frequency-to-current converter and the driver, wherein the current mirror is configured to: receive the reference current; and set the amplitude of the LED current, wherein the amplitude of the LED current is equal to a positive number multiplied by an amplitude of the reference current. Additionally or alternatively, in some examples, the reference current is the LED current. Additionally or alternatively, in some examples, the LED current is the reference signal; the reference signal generator is a switched-capacitor resistor; a resistance of the switched-capacitor resistor is based on the clock frequency; and the LED current is equal to a voltage across the switched-capacitor resistor divided by the resistance. Additionally or alternatively, in some examples, the driver is coupled to a string of LEDs; and a light output level of the string of LEDs is based on the LED current through the string of LEDs.

A method is disclosed. In some examples, the method comprises: receiving, with a reference signal generator having a linear input-to-output relationship, a signal having a clock frequency; inputting the clock frequency to the reference signal generator; generating, using the reference signal generator, a reference signal based on the clock frequency of the signal and the linear input-to-output relationship; receiving, with a light emitting diode (LED) driver coupled to the reference signal generator, the reference signal; and driving a LED current having an amplitude, the amplitude of the LED current based on the reference signal. Additionally or alternatively, in some examples, the method further comprises: generating, using a phase locked loop (PLL), a signal having an output frequency; generating, using a divide-by-N counter coupled to the PLL and the reference signal generator, a feedback signal having an input frequency; and generating, using the divide-by-N counter, the signal having the clock frequency, wherein: the input frequency is equal to the output frequency divided by a number $N_1$, the number $N_1$ selected based on a frequency of the LED current; and the clock frequency is equal to the output frequency divided by a number $N_2$, the number $N_2$ is selected based on the generated reference signal. Additionally or alternatively, in some examples, the method further comprises: receiving, with the divided-by-N counter, a K-bit frequency select control signal; and generating, with the PLL, $2^K$ output frequencies, wherein the K-bit frequency select control signal is based on the number $N_1$. Additionally or alternatively, in some examples, the method further comprises: receiving, with the divided-by-N counter, a L-bit frequency select control signal; and generating, with the divided-by-N counter, $2^L$ clock frequencies, wherein the L-bit frequency select control signal is based on the number $N_2$. Additionally or alternatively, in some examples, the method further comprises: receiving, with a pulse width modulation (PWM) signal generator coupled to the LED driver, the signal having the output frequency; varying, with the PWM signal generator, a duty cycle of the signal having the output frequency; producing a PWM control signal having the duty cycle and the output frequency; and controlling, with the PWM control signal, a duty cycle of the LED current. Additionally or alternatively, in some examples, the reference signal is a reference voltage; and the reference signal generator is a frequency-to-voltage converter, and the method further comprise generating, with the frequency-to-voltage converter, the reference voltage based on the linear input-to-output relationship. Additionally or alternatively, in some examples, the reference signal is a reference current; and the reference signal generator is a frequency-to-current converter, and the method further comprises generating, with the frequency-to-current converter, the reference current based on the linear input-to-output relationship. Additionally or alternatively, in some examples, the LED current is the reference signal; the reference signal generator is a switched-capacitor resistor; a resistance of the switched-capacitor resistor is based on the clock frequency; and the LED current is equal to a voltage across the switched-capacitor resistor divided by the resistance, and the method further comprises switching the switched-capacitor resistor at the clock frequency to generate the resistance. Additionally or alternatively, in some examples, the driver is coupled to a string of LEDs; and a light output level of the string of LEDs is based on the LED current through the string of LEDs.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A circuit comprising:
a reference signal generator configured to:
receive a clock signal having a particular frequency; and
generate a reference signal using the clock signal, wherein a magnitude of the reference signal is proportional to the particular frequency; and
a light emitting diode (LED) driver coupled to the reference signal generator, the LED driver configured to:
receive the reference signal; and
drive a LED current having an amplitude, the amplitude of the LED current based on the reference signal.

2. The circuit of claim 1, further comprising:
a phase locked loop (PLL) configured to generate a signal having an output frequency; and
a divide-by-N counter coupled to the PLL and the reference signal generator, the divide-by-N counter configured to generate a feedback signal having an input frequency and
to generate the clock signal having the particular frequency, wherein:
the input frequency is equal to the output frequency divided by a number N1, the number N1 selected based on a frequency of the LED current; and
the particular frequency is equal to the output frequency divided by N2, wherein N2 is a number selected using the reference signal.

3. The circuit of claim 2, wherein the divide-by-N counter is further configured to receive a K-bit frequency select control signal that is based on the number N1; and
wherein the PLL is further configured to generate 2K output frequencies.

4. The circuit of claim 2, wherein:
the divide-by-N counter is further configured to receive a L-bit frequency select control signal;
the L-bit frequency select control signal is based on the number N2; and
the divide-by-N counter is configured to generate 2L clock frequencies.

5. The circuit of claim 2, further comprising a pulse width modulation (PWM) signal generator coupled to the LED driver and configured to:
receive the signal having the output frequency;
vary a duty cycle of the signal having the output frequency; and
produce a PWM control signal having the duty cycle and the output frequency, wherein the PWM control signal controls a duty cycle of the LED current.

6. The circuit of claim 1, wherein:
the reference signal is a reference voltage; and
the reference signal generator is a frequency-to-voltage converter, the frequency-to-voltage converter configured to generate the reference voltage, wherein a magnitude of the reference voltage is proportional to the particular frequency.

7. The circuit of claim 1, wherein:
the reference signal is a reference current; and
the reference signal generator is a frequency-to-current converter, the frequency-to-current converter configured to generate the reference current, wherein a magnitude of the reference current is proportional to the particular frequency.

8. The circuit of claim 7, further comprising a current mirror coupled to the frequency-to-current converter and the driver, wherein the current mirror is configured to:
receive the reference current; and
set the amplitude of the LED current, wherein the amplitude of the LED current is equal to a positive number multiplied by an amplitude of the reference current.

9. The circuit of claim 7, wherein the reference current is the LED current.

10. The circuit of claim 1, wherein:
the LED current is the reference signal;
the reference signal generator is a switched-capacitor resistor;
a resistance of the switched-capacitor resistor is based on the particular frequency; and
the LED current is equal to a voltage across the switched-capacitor resistor divided by the resistance.

11. The circuit of claim 1, wherein:
the driver is coupled to a string of LEDs; and
a light output level of the string of LEDs is based on the LED current through the string of LEDs.

12. A method comprising:
receiving, with a reference signal generator, a clock signal having a particular frequency;
generating, using the reference signal generator, a reference signal using the clock signal, wherein a magnitude of the reference signal is proportional to the particular frequency;
receiving, with a light emitting diode (LED) driver coupled to the reference signal generator, the reference signal; and
driving a LED current having an amplitude, the amplitude of the LED current based on the reference signal.

13. The method of claim 12, further comprising:
generating, using a phase locked loop (PLL), a signal having an output frequency;
generating, using a divide-by-N counter coupled to the PLL and the reference signal generator, a feedback signal having an input frequency; and
generating, using the divide-by-N counter, the clock signal having the particular frequency, wherein:
the input frequency is equal to the output frequency divided by a number N1, the number N1 selected based on a frequency of the LED current; and
the particular frequency is equal to the output frequency divided by a number N2, the number N2 is selected using the reference signal.

14. The method of claim 13, further comprising:
receiving, with the divide-by-N counter, a K-bit frequency select control signal; and generating, with the PLL, 2K output frequencies,
wherein the K-bit frequency select control signal is based on the number N1.

15. The method of claim 13, further comprising:
receiving, with the divide-by-N counter, a L-bit frequency select control signal; and
generating, with the divide-by-N counter, 2L clock frequencies,
wherein the L-bit frequency select control signal is based on the number N2.

16. The method of claim 13, further comprising:
receiving, with a pulse width modulation (PWM) signal generator coupled to the LED driver, the signal having the output frequency;
varying, with the PWM signal generator, a duty cycle of the signal having the output frequency;
producing a PWM control signal having the duty cycle and the output frequency; and controlling, with the PWM control signal, a duty cycle of the LED current.

17. The method of claim 12, wherein:
the reference signal is a reference voltage; and the reference signal generator is a frequency-to-voltage converter, and the method further comprise generating, with the frequency-to-voltage converter, the reference voltage, wherein a magnitude of the reference voltage is proportional to the particular frequency.

18. The method of claim 12, wherein:

the reference signal is a reference current; and the reference signal generator is a frequency-to-current converter, and the method further comprises generating, with the frequency-to-current converter, the reference current, wherein a magnitude of the reference current is proportional to the particular frequency.

19. The method of claim 12, wherein:

the LED current is the reference signal;

the reference signal generator is a switched-capacitor resistor;

a resistance of the switched-capacitor resistor is based on the particular frequency; and the LED current is equal to a voltage across the switched-capacitor resistor divided by the resistance, and the method further comprises switching the switched-capacitor resistor at the particular frequency to generate the resistance.

20. The method of claim 12, wherein:

the driver is coupled to a string of LEDs; and a light output level of the string of LEDs is based on the LED current through the string of LEDs.

* * * * *